United States Patent [19]

Furuta et al.

[11] Patent Number: 5,397,718

[45] Date of Patent: Mar. 14, 1995

[54] METHOD OF MANUFACTURING THIN FILM TRANSISTOR

[75] Inventors: Mamoru Furuta; Tetsuya Kawamura; Tatsuo Yoshioka; Hiroshi Sano, all of Hirakata; Yutaka Miyata, Ikoma, all of Japan

[73] Assignee: Matsushita Electric Industrial Co., Ltd., Osaka, Japan

[21] Appl. No.: 19,682

[22] Filed: Feb. 19, 1993

[30] Foreign Application Priority Data

Feb. 21, 1992 [JP] Japan .................... 4-034660
Aug. 3, 1992 [JP] Japan .................... 4-205836

[51] Int. Cl.⁶ ............................. H01L 21/265
[52] U.S. Cl. ......................... 437/40; 437/21; 437/29; 437/913; 148/DIG. 150
[58] Field of Search ............... 437/40, 41, 29, 28, 437/45, 46, 913, 21; 148/DIG. 150

[56] References Cited

U.S. PATENT DOCUMENTS

| | | |
|---|---|---|
| 4,312,680 | 1/1982 | Hsu ........................ 437/41 |
| 4,463,492 | 8/1984 | Maeguchi ................. 437/41 |
| 4,523,963 | 6/1985 | Ohta et al. ............... 437/29 |
| 4,951,113 | 8/1990 | Huang et al. ............. 437/40 |
| 4,992,838 | 2/1991 | Mori . | |
| 5,064,775 | 11/1991 | Chang .................... 437/29 |
| 5,116,771 | 5/1992 | Karulkar ................. 437/40 |
| 5,198,379 | 3/1993 | Adan ..................... 437/41 |
| 5,252,502 | 10/1993 | Havemann ................ 437/41 |

FOREIGN PATENT DOCUMENTS

| | | |
|---|---|---|
| 54-21180 | 2/1979 | Japan .................... 437/40 |
| 58-206121 | 12/1983 | Japan .................... 437/29 |
| 60-128668 | 7/1985 | Japan .................... 437/45 |
| 61-48979 | 3/1986 | Japan .................... 437/913 |
| 63-283068 | 11/1988 | Japan .................... 437/46 |
| 3-276765 | 12/1991 | Japan . | |
| 0494133 | 3/1992 | Japan .................... 437/200 |
| 4-134831 | 5/1992 | Japan . | |

OTHER PUBLICATIONS

Komatsu, English abstract of 03-276765-JA.
"Formation of Source and Drain Regions for a Si:] Thin-Film Transistors by Low-Energy Ion Doping Technique", Yoshida et al., IEEE Electron Device Letters, vol. 9, No. 2, Feb. 1988, pp. 90–93.

Primary Examiner—Brian E. Hearn
Assistant Examiner—Michael Trinh
Attorney, Agent, or Firm—Wenderoth, Lind & Ponack

[57] ABSTRACT

In a method of manufacturing a thin film transistor, when impurity ions are introduced in a channel region between source and drain regions in a semiconductor layer, an insulator layer is first formed on the semiconductor layer. Then, impurity ions generated on high frequency discharge are introduced through the insulator layer into the semiconductor layer under a specified acceleration voltage. Then, the introduction depth of impurities and the amount of the impurities to be introduced in the channel region can be controlled or the threshold voltage of the thin film transistor can be controlled. This method can be applied to a large substrate.

8 Claims, 5 Drawing Sheets

METHOD OF MANUFACTURING THIN FILM TRANSISTOR

BACKGROUND OF THE INVENTION

1. Field of the Invention

The present invention relates to a method of manufacturing a thin film transistor and semiconductor devices such as a liquid crystal display, an image sensor and a memory including thin film transistors.

2. Description of the Prior Art

In a semiconductor device such as a liquid crystal display or an image sensor using thin film transistors, the control of the threshold voltage of the thin film transistor is important. Especially for an active-matrix type liquid crystal display which includes peripheral circuits, it is necessary to control the threshold voltages of p- and n-channel thin film transistors in the periphery circuits for decreasing the dissipation of electrical power and for driving at a faster rate. The threshold voltage is mainly controlled by the state at the interface between the semiconductor active layer and the gate insulator layer in the thin film transistor, and it is not easy to control the threshold voltage in a wide range.

Previously, channel doping techniques are used for controlling the threshold voltage of a thin film transistor. In the channel doping technique, the ion implantation process is used to introduce a very small amount of impurities into a semiconductor active layer. However, the size of the ion beam is small in the prior art technique. When impurities are introduced into a substrate having a large area as such used for a liquid crystal display or the like, the ion beam has to scan over the large substrate, and this limits the area to be processed and the throughput of the processing. Therefore, it is difficult to adopt the ion implantation technique for manufacturing thin film transistors on a large substrate. Furthermore if the ion implantation is carried out on an insulator substrate such as a silica or glass plate, a charge up phenomenon occurs or the substrate is charged due to the implanted ions, and this lowers the precision of the implantation. Therefore, it is desirable to introduce impurities while preventing the charge up of the substrate.

SUMMARY OF THE INVENTION

An object of the present invention is to provide a method for controlling the threshold level of thin film transistor at a desired level.

In a method of manufacturing a thin film transistor, when impurity ions are introduced in the channel region between the source and drain regions, an insulator layer is first formed on a non-monocrystalline thin film of a semiconductor material. Then, impurity ions generated by a high frequency discharge are introduced through the insulator layer into the semiconductor layer under a specified acceleration voltage. Then, the introduction depth of impurities and the amount of the impurities to be introduced in the channel region can be controlled or the threshold voltage of the thin film transistor can be controlled. That is, the impurities are introduced without using mass separation of the ions. In order to improve the controllability of the threshold voltage, the acceleration voltage on the introduction into the non-monocrystalline thin film is preferably 80 kV or less or the dose of the impurity ions for controlling the valence electrons is preferably $5*10^{15}$ ion/cm$^2$ or less.

An advantage of the present invention is that ions can be introduced into the channel region of the thin film transistor on a large substrate.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1A:
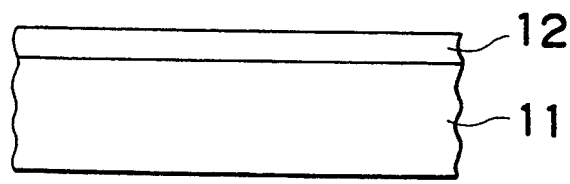
FIGS. 1(a)–1(d) are sectional views illustrating an example of a method of manufacturing a top gate type thin film transistor in accordance with a first embodiment of the present invention.

Referring now to the drawings, wherein like reference characters designate like or corresponding parts throughout the several views, embodiments of the present invention are explained below.

In order to solve the above-mentioned problems, a technique called an ion doping or ion shower doping is adopted in the present invention (refer to "Formation of Source and Drain Regions for a-Si:H Thin-Film Transistors by Low-Energy Ion Doping Techniques", IEEE Electron Devices Letters, Vol. 9, No. 2, 1988, 90–93 on the technique). A gas including impurities to be introduced as constituent elements thereof is ionized by using a high frequency discharge, and the ionized impurities to be introduced into a sample are all accelerated at a specified acceleration voltage. In the present invention, generated ions are all introduced into a sample without using mass separation of the generated ions as in the prior art ion implantation. Because mass separation is not needed, the size of the ion beam can be increased as the size of the ion generator is increased. Thus, the ion beam size can be increased so as to be larger than that of the prior art, and the impurities can be introduced over a large substrate at a faster rate.

Figure 1B:
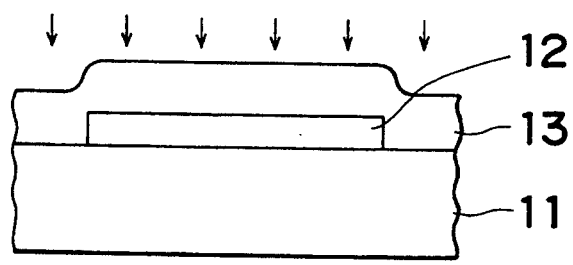

FIGS. 1(a)–1(d) illustrate a method of manufacturing a top gate type n-channel thin film transistor in accordance with a first embodiment of the present invention. As shown in FIG. 1(a), a polycrystalline silicon thin film 12 of 100 nm thickness is first formed on a transparent substrate (glass substrate) 11. Next, the polycrystalline silicon 12 is etched to form an island as shown in FIG. 1(b), and a silicon oxide thin film 13 of 200 nm thickness is formed as a gate insulator layer. Then, boron is introduced into the polycrystalline silicon thin film 12 for the channel region near the interface between the insulator layer 13 and the polycrystalline silicon thin film 12 by the ion doping technique wherein ions are generated by decomposing $B_2H_6$ gas on the high frequency discharge without using mass separation of the generated ions. At the decomposition of the $B_2H_6$ gas, ions of boron hydrides such as $BH_x$ and $B_2H_x$ and hydrogen ions are generated as well as boron ions, and they are introduced into the sample. On introducing boron in the polycrystalline silicon thin film 12, the acceleration voltage is 30 kV, and the total dose of boron is $1*10^{14}$ ions/cm$^2$.

Figure 2:
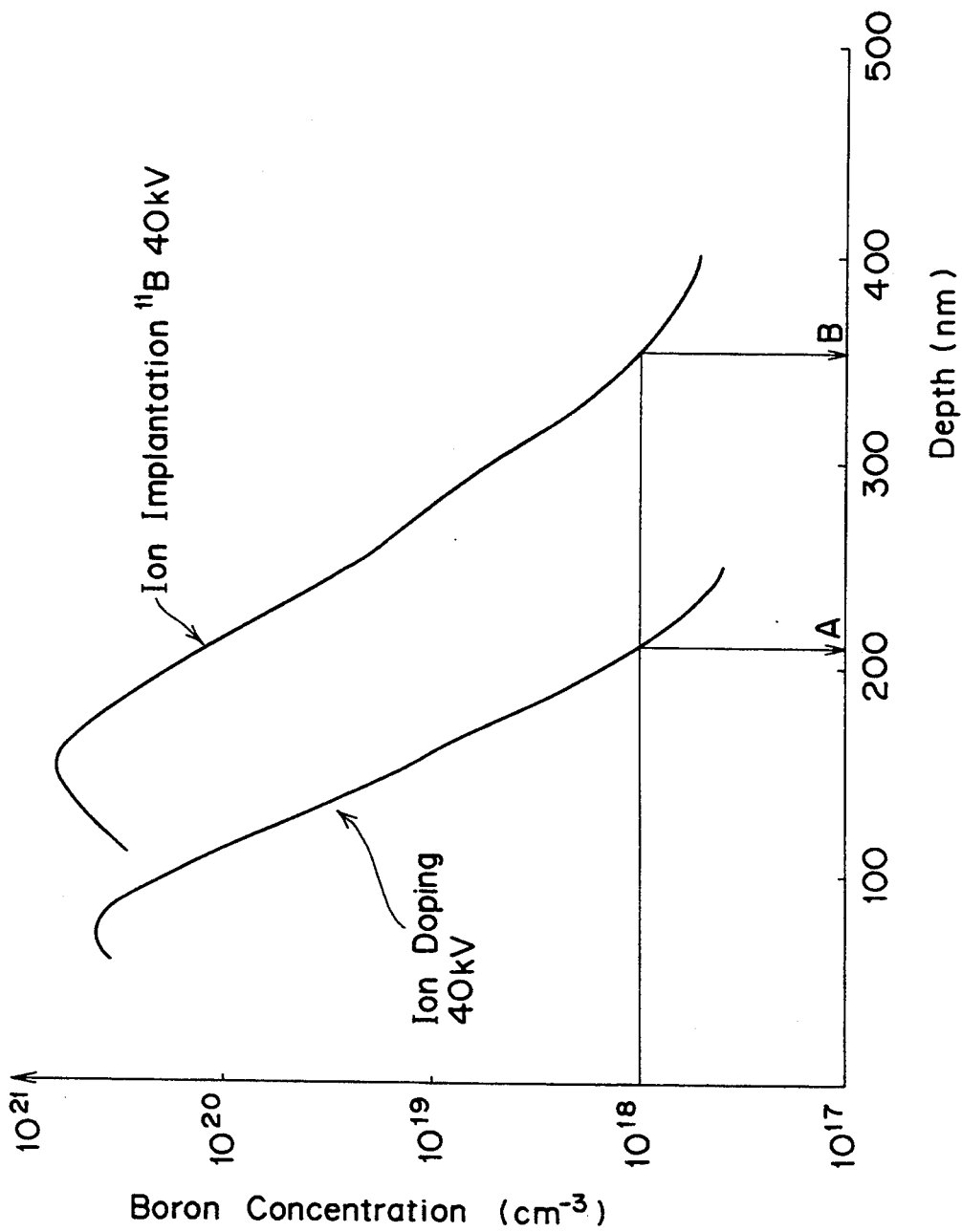
FIG. 2 is a graph of the distribution of the implanted ions.

FIG. 2 shows two examples of the distribution of boron density in the depth direction after boron is introduced into a monocrystalline silicon substrate with the ion doping technique and with the ion implantation technique (comparison example) in conditions of 40 kV of acceleration voltage and a dose of $5*10^{15}$ ions/cm$^2$ of boron. The abscissa represents the depth from the surface of the substrate, while the ordinate represents the boron (impurity) concentration. In the case of ion doping, $B_2H_x$ ions can be generated mainly from $B_2H_6$ gas, and a sharp impurity concentration distribution can be realized. For example, if the impurity concentration to be introduced in the channel region is $1*10^{18}$ ions/cm$^3$ of boron, an insulator layer of 210 nm thickness (refer to point A in FIG. 2) is needed to hinder the impurities in the ion doping technique, whereas an insulation layer of 350 nm thickness (refer to point B in FIG. 2) is needed in the ion implantation technique. Thus, by using the ion doping technique, the thickness of an insulator layer (the gate insulator layer 22 in the present embodiment) needed for the introduction of impurities can be decreased when the same concentration of impurities is introduced, and the characteristics of a device including the thin film transistor can be improved.

Figure 1C:
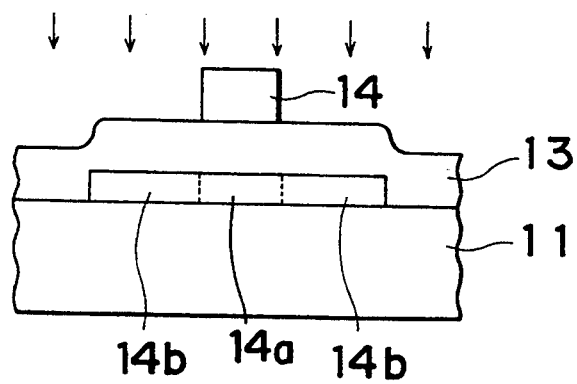
Figure 1D:
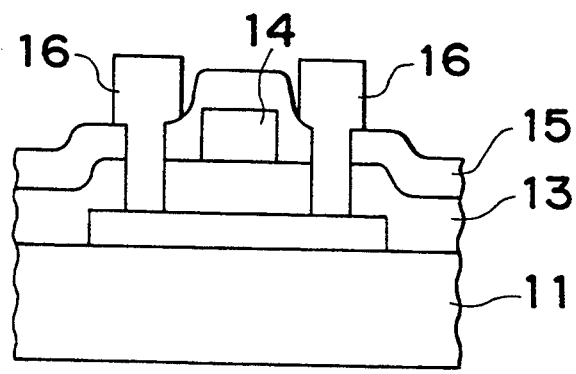

As shown in FIG. 1(c), after the activation annealing of the introduced boron is performed at 400° C. for 60 minutes, a gate electrode 14 of chromium of 100 nm thickness is formed on the gate insulator layer 13. Next, phosphor ions are generated by decomposing PH$_3$ gas by using the high frequency discharge, and they are introduced, using the gate electrode 14 as a mask, into the source and drain regions 14b in the polycrystalline silicon thin film 12 at a high concentration, in the conditions of the acceleration voltage of 80 kV and the dose of the total amount of the impurity ions of $3*10^{15}$ ions/cm$^2$. The source and drain regions 14b are formed by self-alignment. Thus, a region between the source and drain regions 14b becomes a channel region 14a. Next, the impurity activation annealing of the source and drain regions 14b are performed. Then, as shown in FIG. 1(d), an inter-layer insulator layer 15 is formed, and contact holes for the source and drain regions 14b are opened. Next, hydrogen plasma treatment is carried out to deactivate dangling bonds in the polycrystalline silicon thin film 12 to form the source and drain regions 14b. Finally, source and drain electrodes 16 are formed through the openings, to complete a thin film transistor.

A characteristic of the present embodiment is that the impurities are introduced into the channel region 14a for the control of the threshold voltage of the thin film transistor during the manufacturing process, as shown in FIG. 1(c). The threshold voltage can be controlled so as to be at a desired value by changing the channel doping conditions (acceleration voltage or the total dose of impurities to be introduced). In the present embodiment, the threshold voltage can be changed by 5 V in the ion doping conditions of the acceleration voltage of 35 kV and the dose of boron of $1*10^{14}$ ions/cm$^2$.

Though the channel doping step is performed after forming the gate insulator layer 13 as shown in FIG. 1(b) in the present embodiment, the sequence of the steps is not limited at the above-mentioned one, and a similar advantage can be obtained when the channel doping step is included during the manufacturing process of the thin film transistor. Further, the threshold voltage of the thin film transistor can be controlled without using the channel doping step if the film thickness of the gate electrode 14 is so thin as to reduce the hindrance of the gate electrode 14 against the ions on forming the source and drain regions 14b, and ions are introduced in the channel region between the source and drain regions 14b to change the concentration difference between the source and drain regions 14b.

Though an n-channel thin film transistor is manufactured in the above-mentioned embodiment, a p-channel thin film transistor can also be manufactured by using appropriate species of impurities.

By using the ion source, the ion beam size is determined only by the size of the ion source, and the introduction to a substrate of wide area becomes easy by enlarging the size of the ion source. Furthermore, the cost of manufacturing can be reduced by the reduction of the cost of an apparatus and the improvement of the throughput.

Figure 3A:
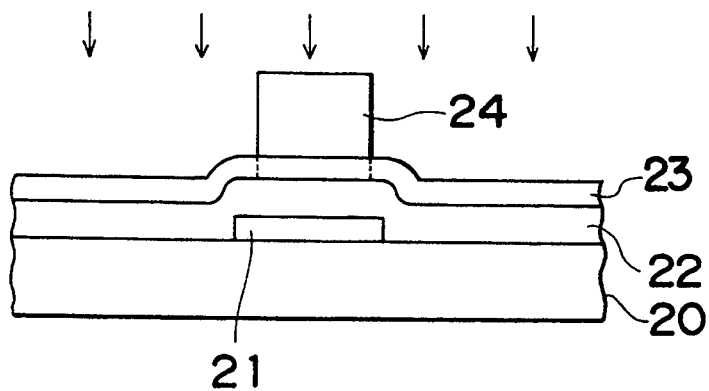
FIGS. 3(a)–3(c) are sectional views illustrating a method of manufacturing of a first example of a bottom gate type thin film transistor in accordance with a second embodiment of the present invention.
Figure 3B:
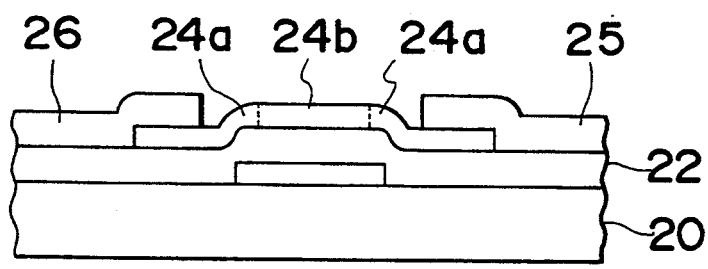

Next, an example of a second embodiment of a method of manufacturing a bottom gate type thin film transistor is explained below with reference to FIGS. 3(a)-3(c). As shown in FIG. 3(a), a gate electrode 21 made of chromium of 100 nm thickness is first formed on a transparent substrate (glass substrate) 20, and a gate insulator layer 22 of silicon nitride of 400 nm thickness and an amorphous silicon thin film of 50 nm thickness are formed successively on the gate electrode 21 in a vacuum by a plasma chemical vapor deposition process (PCVD). Then, the amorphous silicon thin film is crystallized by thermal annealing at about 600° C. to form a polycrystalline silicon thin film 23 as a semiconductor active layer. Then, after a doping mask 24 is formed on the polycrystalline silicon thin film 23, ions of impurities (phosphorus in this case) are introduced into source and drain regions in the polycrystalline silicon thin film 23 by an ion doping apparatus. That is, PH$_3$ gas is decomposed on high frequency discharge to generate phosphorus ions, and the generated ions are introduced in the source and drain regions 24a, without mass separation, as shown in FIG. 3(b). The conditions for forming the source and drain regions 24a are as follows: 20 kV of acceleration voltage, and a total dose of $1*10^{15}$ ions/cm$^2$ of phosphorus. Impurities are not introduced into a channel region 24b below the mask 24 between the source and drain regions 24a. After the activation annealing of the implanted impurities, the polycrystalline silicon is etched to form an island pattern, then the source and drain electrodes 25 and 26 are formed on the source and drain regions, as shown in FIG. 3(b).

Figure 3C:
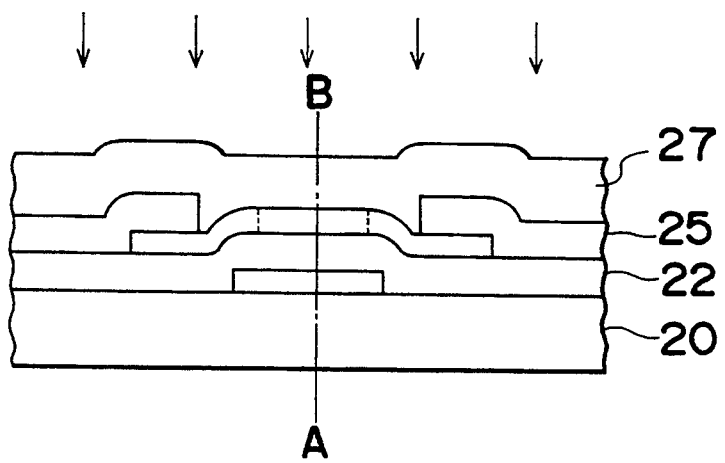

Next, as shown in FIG. 3(c), a passivation layer 27 of silicon oxide of 200 nm thickness is formed. After the plasma treatment in a hydrogen plasma to deactivate the dangling bonds in the polycrystalline silicon thin film 23, boron is introduced for the control of the threshold voltage from above the passivation layer 27 of insulator into the semiconductor active layer 23 to form a channel region 24b between the source and drain regions 24a. The introduced boron is activated in the conditions of 400° C. for 60 minutes, and a thin film transistor is completed. An ion doping apparatus is used to introduce boron ions for the control of the threshold voltage, and B$_2$H$_6$ gas is decomposed on high frequency discharge and the generated ions are introduced in the sample without mass separation. The conditions for the control of the threshold voltage is as follows: 35 kV of acceleration voltage, and a dose of $1*10^{14}/cm^2$. Thus, a thin film transistor is completed.

Figure 4:
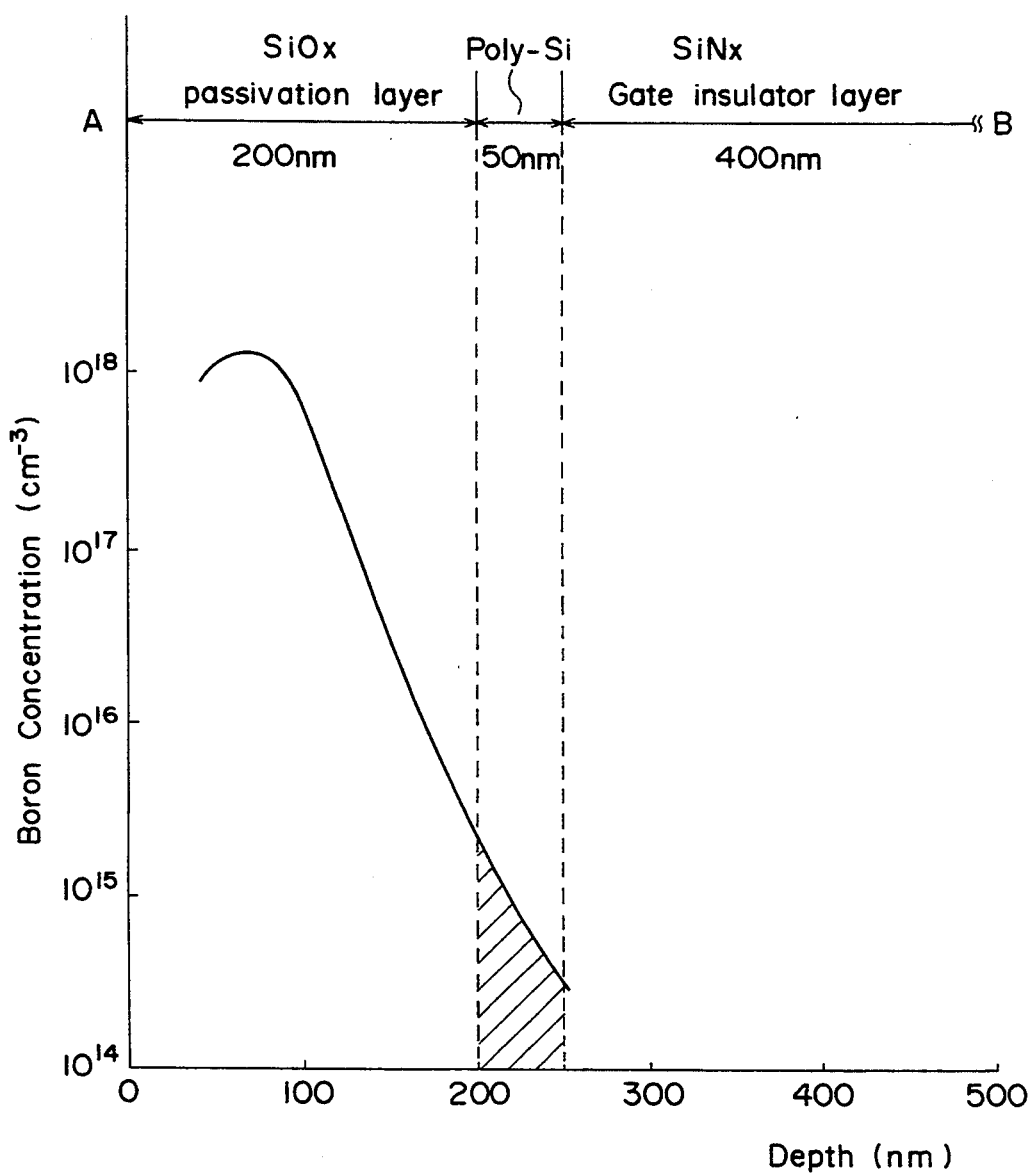
FIG. 4 is a graph of the distribution of the boron density along A-B line in FIG. 3(c)

FIG. 4 shows an example of the impurity distribution after boron is introduced for the control of the threshold voltage along the A-B line displayed in FIG. 3(c). Because the impurities are introduced through the silicon oxide layer 27, most of the impurities remain in the inactive state in the silicon oxide layer 27, and only a very small amount at the tail of the impurity distribution is introduced into the active layer 23 (refer the hatched area in FIG. 4). Thus, the above-mentioned method makes it possible to control the very small amount of impurities beyond the control limit of the ion doping apparatus. Further, the damages at the interface between the polycrystalline silicon 23 and the silicon nitride (gate insulator layer) 22 caused by the ion implantation in the prior art method can be suppressed and the characteristics of the thin film transistor can be improved. It is to be noted that the amount of impurities to be introduced in the active layer 23 can be controlled at a desired level by controlling the acceleration voltage and the film thickness of the insulator layer 27. It is found that silicon oxide film is the best insulator layer for the control of threshold voltage.

By using the above-mentioned method of manufacturing, the threshold voltage of a thin film transistor of a bottom gate structure can be controlled by changing the introduction conditions of boron. Further, most of the impurities are deactivated in the silicon oxide thin film, and only a tail portion of the impurity distribution is introduced into the active layer. Therefore, the implantation depth into the active layer can be controlled at a desired value by the acceleration voltage on the ion doping and the thickness of the insulator layer on the thin film transistor. In the channel doping conditions according to the example, the threshold voltage varies by about 5 volts.

Further, in the example shown in FIGS. 3(a)–3(c), thermal annealing is used for crystallizing and for activating the introduced impurities. However, similar advantages can be realized with a laser annealing or rapid thermal annealing (RTA) process. When a laser is used, after the impurities are introduced into the source and drain regions, the crystallization of the semiconductor active layer can be performed at the same time as the activation of the impurities in the source and drain regions. Thus, the manufacturing process can be simplified.

Though the method of manufacturing n-channel thin film transistor is explained above, a p-channel thin film transistor can also be manufactured similarly.

Figure 5A:
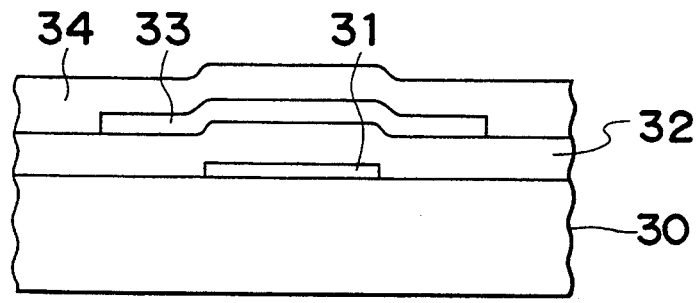
FIGS. 5(a)–5(d) are sectional views illustrating a method of manufacturing a second example of a bottom gate type thin film transistor in accordance with the second embodiment of the present invention.
Figure 5B:
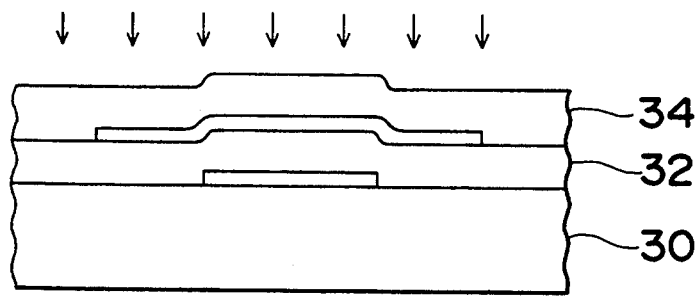

Next, a second example embodiment of a method of manufacturing a bottom gate type thin film transistor is explained below with reference to FIGS. 5(a)–5(d). As shown in FIG. 5(a), a gate electrode 31 made of chromium of 100 nm thickness is first formed on a transparent substrate (glass substrate) 30, and a gate insulator layer 32 of silicon nitride of 400 nm thickness and a polycrystalline silicon thin film of 50 nm thickness used as a semiconductor active layer 33 are formed successively on the gate electrode 31 in a vacuum by a plasma chemical vapor deposition process (PCVD). Then, after an island of the polycrystalline silicon thin film is formed, a passivation insulator layer 34 of silicon oxide of 200 nm thickness is formed. Next, as shown in FIG. 5(b), boron ions are introduced through the passivation insulator layer 34 into the semiconductor active layer 33 to control the threshold voltage. The ions of impurities for the control of the threshold voltage are introduced by an ion doping apparatus. That is, $B_2H_6$ gas is decomposed on high frequency discharge to generate boron ions, and the generated ions are introduced into the sample, without mass separation of the generated ions. The conditions for the threshold voltage control are as follows: 35 kV of acceleration voltage, and a dose of $1*10^{14}$ ions/cm$^2$.

Figure 5C:
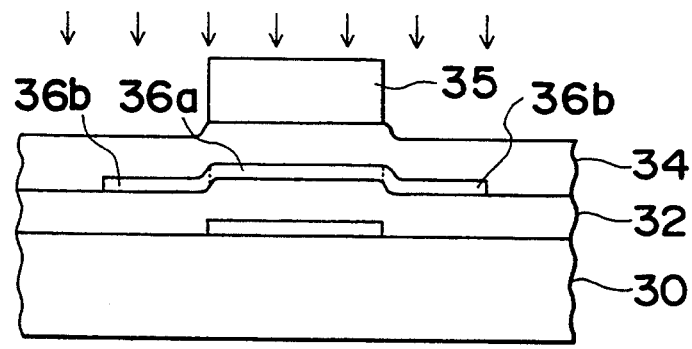

Next, as shown in FIG. 5(c), a doping mask 35 is formed by a photoresist, and impurities (boron) are introduced into the source and drain regions 36b. The region between the source and drain regions 36b becomes a channel region 36a. The ion doping apparatus is used to introduce the boron ions, and $B_2H_6$ gas is decomposed on high frequency discharge and the generated ions are introduced into the source and drain regions 36b without mass separation. The conditions for forming the source and drain regions are as follows: 60 kV of acceleration voltage, and a total dose of $5*10^{15}$ ions/cm$^2$ of impurities. By using the above-mentioned conditions, the threshold voltage can be changed by 5 volts.

Figure 5D:
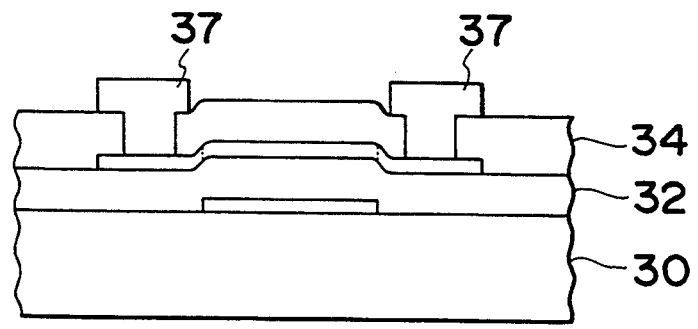

After the activation annealing of the impurities at 400° C. for 60 minutes, contact holes are formed in the passivation layer 34. Then, the plasma treatment is performed to deactivate the dangling bonds in the polycrystalline silicon thin film in the hydrogen plasma, and the source and drain electrodes 37 are formed in the contact holes as shown in FIG. 5(d), to complete a thin film transistor.

Further, in the second example explained above, thermal annealing is used for crystallizing and for activating the implanted impurities. However, a laser annealing or rapid thermal annealing (RTA) process can also be used. When a laser is used, after the impurities are introduced into the source and drain regions, the crystallization of the semiconductor active layer can be performed at the same time as the activation of the impurities in the source and drain regions. Thus, the manufacturing process can be simplified.

Though the method of manufacturing n-channel thin film transistor is explained above, a p-channel thin film transistor can be manufactured similarly. The order of the steps in the example can be changed. For example, similar advantages can be obtained if the steps shown in FIGS. 5(b) and (c) are exchanged. Further, similar advantages can be obtained even if the step shown in FIG. 5(b) is omitted and impurities can be introduced after the step shown in FIG. 5(d) by using the conditions mentioned with reference to FIG. 5(b).

The threshold voltage of the thin film transistor can be controlled at a desired value according to the present invention. Because the ion doping process needs no mass separation of generated ions, the cost of the apparatus is reduced. Further, because it can be applied to a wide area and a high throughput is possible, the manufacturing cost can be reduced.

By setting the thickness of the insulator layer above the active layer of the thin film transistor suitably, doping of a very sharp distribution can be realized without damaging the interface between the channel region and gate insulator layer. Because most of the introduced ions are inactive in the insulator layer and only a very small amount of the implanted ions arrive at the active layer, the implantation at a dose much larger than realized previously becomes possible, and the controllability of the threshold voltage can be improved. The cost of the apparatus is reduced by sharing the apparatus commonly in the steps for introducing impurity ions.

In the present invention, by introducing a very small amount of ionized impurities from above the insulator layer into the semiconductor layer to control the threshold voltage, most of the implanted impurities lose energy in the insulator layer to stop and to be deactivated electrically. Thus, only a portion of the impurities at the tail of the impurity profile is introduced into the semiconductor active layer. Further, the film thickness of the insulator layer can be changed. Then, the depth of the impurity distribution and the amount of the impurities can be controlled at desired values.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A method of manufacturing a thin film transistor comprising the steps of:

forming a gate electrode of a thin film transistor on a substrate;

forming a first insulator layer on the gate electrode and the substrate, said first insulator comprising a gate insulator of the thin film transistor;

forming a non-monocrystalline thin film on the first insulator layer above the gate electrode;

forming source and drain regions of the thin film transistor in the non-monocrystalline thin film by selectively introducing impurities including a first type of ions into the non-monocrystalline thin film;

forming a second insulator layer on the non-monocrystalline thin film; and selectively introducing impurities including a second type of ions into the non-monocrystalline thin film through the second insulator layer, the second type of ions introduced into the non-monocrystalline thin film controlling a threshold voltage of the thin film transistor;

wherein the impurities are introduced into the non-monocrystalline thin film by ionizing a gas by high frequency discharge to generate ions and accelerating all of the generated ions by an acceleration voltage into the non-monocrystalline thin film, the impurities being introduced in the absence of mass separation of the generated ions.

2. The method according to claim 1, wherein the first type of ions are introduced into the non-monocrystalline thin film by using a mask formed on said non-monocrystalline thin film prior to the introduction of the first type of ions, wherein the source and drain regions are formed in a self-alignment condition by using the mask, and wherein the second type of ions are introduced into the non-monocrystalline thin film after the mask has been removed.

3. The method according to claim 1, wherein the second insulator layer formed on said non-monocrystalline thin film is made of silicon oxide.

4. The method according to claim 1, wherein the gas includes boron.

5. The method according to claim 1, wherein the gas includes phosphorus.

6. The method according to claim 1, wherein the acceleration voltage is 80 kV or less than 80 kV.

7. The method according to claim 1, wherein a dosage of the second type of ions introduced into the non-monocrystalline thin film is $5*10^{15}$ ions/cm$^2$ or less than $5*10^{15}$ ions/cm$^2$.

8. The method according to claim 1, wherein the non-monocrystalline thin film comprises a polycrystalline silicon thin film.

* * * * *